United States Patent [19]

Roesner

[11] 4,358,891

[45] Nov. 16, 1982

[54] METHOD OF FORMING A METAL SEMICONDUCTOR FIELD EFFECT TRANSISTOR

[75] Inventor: Bruce Roesner, San Diego, Calif.

[73] Assignee: Burroughs Corporation, Detroit, Mich.

[21] Appl. No.: 297,786

[22] Filed: Aug. 31, 1981

Related U.S. Application Data

[62] Division of Ser. No. 51,058, Jun. 22, 1979.

[51] Int. Cl.³ .................... H01L 21/225; H01L 21/26
[52] U.S. Cl. ........................................ 29/571; 29/591; 148/187; 148/188
[58] Field of Search ................. 29/571, 591; 148/188, 148/187, 1.5; 357/23 R

[56] References Cited

U.S. PATENT DOCUMENTS

| | | | |
|---|---|---|---|
| 3,639,186 | 2/1972 | Forster et al. | 148/187 X |
| 3,804,681 | 4/1974 | Drangeid et al. | 148/187 X |
| 3,906,540 | 9/1975 | Hollins | 357/15 |
| 3,942,241 | 3/1976 | Harigaya et al. | 148/187 X |
| 4,045,248 | 8/1977 | Shannon | 148/1.5 |
| 4,048,712 | 9/1977 | Buiatti | 29/579 X |
| 4,304,042 | 12/1981 | Yeh | 148/187 X |
| 4,305,760 | 12/1981 | Trudel | 148/187 X |

Primary Examiner—G. Ozaki
Attorney, Agent, or Firm—Mervyn L. Young; Charles J. Fassbender; Kevin R. Peterson

[57] ABSTRACT

A metal silicon field effect transistor and the method of producing such a transistor whereby all of the elements of the transistor are defined by a single masking step. These elements include the channel of the first effect transistor as well as the source and drain regions therefor and also the gate which completes the transistor. The transistor is formed by depositing a doped polysilicon layer on the surface of the semiconductor substrate, depositing an oxide layer thereover and opening a via in the insulating layer and the doped polysilicon layer to expose the silicon substrate. The channel is formed by ion implant through the via thus opened. The doped polysilicon layer serves as a diffusant source for the formation of the source and drain regions of the transistor which regions are defined by the via. The via then serves to define the area where the gate is to be formed in contact with the substrate region containing the channel.

9 Claims, 3 Drawing Figures

METHOD OF FORMING A METAL SEMICONDUCTOR FIELD EFFECT TRANSISTOR

This is a division of application Ser. No. 051,058, filed June 22, 1979.

BACKGROUND OF THE INVENTION

1. Field of the Invention

This invention relates to the method of forming a metal semiconductor field effect transistor and the product formed thereby. More particularly, this invention relates to the method of forming such a field effect transistor having a self-aligned gate.

2. Description of the Prior Art

A metal semiconductor field effect transistor, MESFET, differs from a traditional device such as a junction field effect transistor, JFET, and the metal oxide semiconductor field effect transistor, MOSFET. With a standard MOSFET, an oxide insulative layer separates the transistor gate from the semiconductor substrate between the source and drain of the transistor. In the JFET, the gate is in contact with the substrate, which, however, has nevertheless been appropriately doped so that a PN junction is formed. In a MESFET, the gate makes direct contact with the silicon substrate so as to form a Schottky diode by a metal-silicon interface. In the JFET, the PN junction is a minority carrier device while in the MESFET, the Schottky diode is a majority carrier device. In the MESFET and JFET devices, the current conduction is within the bulk of the silicon substrate. While in a MOSFET, the current conduction is along the oxide-silicon interface.

With the conventional methods of the prior art for forming a MESFET, the source and drain areas are first created by diffusion or implant, the channel region is then implanted, and an oxide layer deposited thereover. A via is then opened through the oxide to the silicon substrate between the source and drain areas. The metal gate is then formed in the via which is of a sufficiently small dimension to make certain that the gate does not make ohmic contact with either the drain or source areas as such contact would short out the gate. The alignment of the gate, then, is critical which in turn requires that more space be allowed for the gate. This in turn diminishes the packing density of the circuit. A particular example of this process is disclosed in the Buiatti, U.S. Pat. No. 4,048,712.

It is then an object of the present invention to provide an improved method of forming a metal silicon field effect transistor.

It is another object of the present invention to provide a metal silicon field effect transistor having reduced space requirements.

It is still another object of the present invention to provide an improved metal silicon field effect transistor having a self-aligned gate.

BRIEF DESCRIPTION OF THE DRAWINGS

The above and other objects, advantages and features of the present invention will become more readily apparent to those skilled in the art when taken in conjunction with the following specification and drawings wherein.

SUMMARY OF THE INVENTION

In order to accomplish the above-identified objects, the present invention is directed toward a metal silicon field effect transistor and the method of producing such a transistor whereby all of the elements of the transistor are defined by a single masking step. These elements include the channel of the field effect transistor as well as the source and drain regions therefor and also the gate which completes the transistor. The transistor is formed by depositing a doped polysilicon layer on the surface of the semiconductor substrate, depositing an oxide layer thereover and opening a via in the insulating layer and the doped polysilicon layer to expose the silicon substrate. The channel is formed by ion implant through the via thus opened. The doped polysilicon layer serves as a diffusant source for the formation of the source and drain regions of the transistor which regions are defined by the via. The via then serves to define the area where the gate is to be formed in contact with the substrate region containing the channel.

A feature then of the present invention resides in depositing a doped polysilicon layer on the surface of the semiconductor substrate, depositing an oxide layer thereover and opening a via in the insulating layer and the doped polysilicon layer to expose the silicon substrate; forming a channel by ion implant through the via thus opened, employing the doped polysilicon layer as a diffusant source for the formation of the source and drain regions of the transistor which regions are defined by the via, and employing the via to define the area where the gate is to be formed in contact with the substrate region containing the channel.

A second feature of the present invention resides in the manner in which the via is formed by undercutting the insulating layer to insure that the polysilicon layer does not make contact with the gate metal.

GENERAL DESCRIPTION OF THE INVENTION

Figure 1:
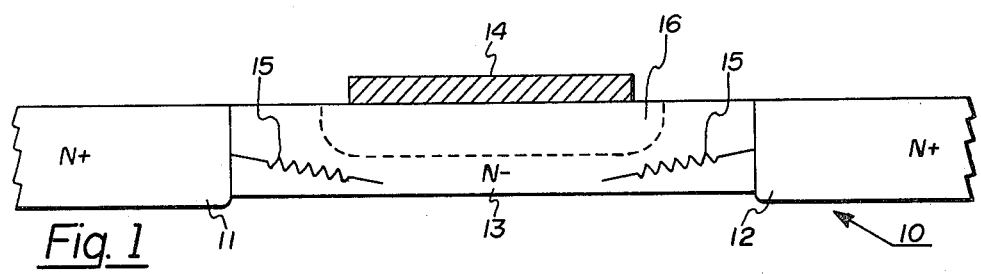
FIG. 1 is a cross-section of a prior art MESFET.

A prior art structure and the method of making such a structure will now be described in relation to FIG. 1. As shown therein, a substrate 10 is provided with source and drain areas 11 and 12 which are formed by N+ dopants, e.g., phosphorus or arsenic, respectively. The channel area 13 is formed with N− dopants, e.g., phosphorus or arsenic. An oxide layer (not shown) is then provided to cover the entire surface and the via is opened therein to form the area of gate 14 which is then formed. Metal gate 14 is in contact with the channel region so that when a voltage is applied thereto it will change the potential or depletion region 16. Conductors to apply the appropriate voltages are then provided to make contact with source and drain areas 11 and 12 and the surface is passivated to form a complete device. A particular problem with such a device is that of aligning gate 14 between the respective source and drain regions 11 and 12. If gate 14 makes contact with either such region, it will form an ohmic contact and gate 14 will be shorted to either the source or drain region. Therefore, there is a critical alignment problem with the prior art MESFET devices. Furthermore, because of the tolerances that must be allowed for this alignment, the gate area requires an extra area which in turn decreases the packing density of the circuit. This extra area in turn degrades the electrical characteristics of the device in that there is a higher source-drain series resistance created as indicated schematically in FIG. 1 as resistances 15. Thus, the separation between the gate and the drain or source is dependent upon the minimum masking alignments.

Figure 2:
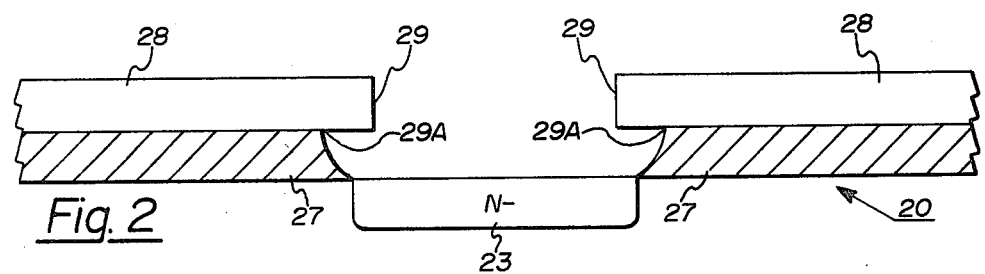
FIG. 2 is a cross-section of a device created by the present invention during its fabrication.

The manner in which the present invention overcomes the disadvantages of the prior art will now be described in relation to FIGS. 2 and 3. As illustrated in FIG. 2, a doped polysilicon conductor 27, e.g., arsenic or phosphorus is deposited on substrate 20 and is then covered with insulator 28. The polysilicon conductor is used both as a diffusant source, as will be more thoroughly described below, and also as part of the interconnect structure. Insulator 28 and conductor 27 are masked and etched to form via 29 in insulator 28 and also to undercut conductor 27 as illustrated in FIG. 2 at 29A. In this manner, via 29 and insulator 28 serves to self-align both the channel region and the gate as will be further described below. N channel area 23 is then formed by implanting through via 29. A second layer is then deposited in the via such that it fills in the exposed edges of conductor 27 in a manner not shown.

Figure 3:
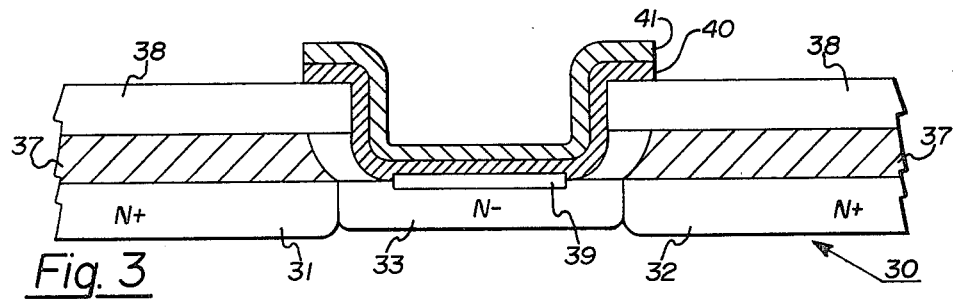
FIG. 3 is a cross-section of a MESFET of the present invention in its completed form.

Referring now to FIG. 3, a high temperature step, e.g., at approximately 800° or 900° C., is now performed to cause the N+ dopants of doped conductors 37 to diffuse into substrate 30 thus forming source and drain areas 31 and 32, respectively. At this time channel region 33 also diffuses outwardly. The second insulator (not shown) is then etched in the preferential manner, such as by a plasma etch or implanting the insulator regions parallel to the wafer surface, then performing a chemical etch to preferentially remove the insulator. The result is to expose that portion of the substrate with which a Schottky diode is to be formed.

The structure in FIG. 3 is completed by the formation of platinum silicide region 39 to create the Schottky diode and then the deposition of titanium-tungsten layer 40 and finally aluminum layer 41. Platinum silicide region 39 is formed by covering the entire wafer with a platinum layer, portions of which are then sintered within each of vias 29 of FIG. 2 by an anneal process. During this sintering, the platinum reacts with the silicon substrate to form platinum silicide region 39. Also, during this anneal operation, a thin oxide layer (not shown) is formed over the platinum silicide. After the anneal operation, the wafer is exposed to a hot aqua regia solution to etch away the platinum not covered by the thin oxide layer which does not protect the platinum silicide region. As was indicated above, a titanium-tungsten layer 40 is then formed as was indicated above to make contact with platinum silicide region 39 and aluminum layer 41 is then deposited thereover. The purpose of the titanium-tunsten layer is to prevent aluminum layer 41 from penetrating into the platinum silicide. Pure tungsten can also be used for this purpose. The titanium-tunsten and aluminum structures are then patterned simultaneously and the resultant structure is as illustrated in FIG. 3. Additional interconnect structures are then provided and the circuit is complete.

The self-alignment method of the present invention serves a number of functions. The opening of the via in the insulating layer 28 and the doped polysilicon layer 27 of FIG. 2 serves to define both the channel region 23 of FIG. 2 as well as the subsequent source and drain regions 31 and 32 of FIG. 3 which are created by the diffusing step where doped polysilicon layer 37 serves as the diffusant source. This via in insulating layer 38 of FIG. 3 in turn serves to align the gate structure with channel structure 33. Because of the manner in which insulating layer 38 was undercut during the process, source and drain areas 31 and 32 can then be created very close to the gate structure location while insuring there will not be any ohmic contact therebetween.

EPILOGUE

A metal silicon field effect transistor and the method of forming such a transistor has been described, which transistor is characterized by the reduced area required on the substrate for the formation thereof as well as an increased packing density of the circuit employing such devices. The device is also characterized by having a reduced channel resistance because of the reduced area required between the source and drain to accommodate the gate. These features are accomplished while insuring that the gate does not make ohmic contact with either the source or drain areas of the transistor.

While only one embodiment of the present invention has been described, it will be evident to one skilled in the art that changes and modifications can be made therein without departing from the spirit and scope of the invention as claimed.

What is claimed is:

1. A method of forming a metal semiconductor field effect transistor, said method comprising the steps of:
   forming a conductor which contains dopant atoms on a surface of a semiconductor substrate;
   forming a first insulating layer over said conductor and said surface of said substrate;
   opening a first via in said first insulating layer and said conductor to expose said substrate and said conductor;
   implanting impurities of a given conductivity through said via into said substrate to form a lightly doped channel region of said transistor;
   forming a second insulating layer in said first via such that it covers the exposed substrate and conductor;
   diffusing said dopant atoms from said conductor into said substrate to form heavily doped source and drain regions of said transistor;
   opening a second via in said second insulating layer to expose said substrate between said diffused dopant atoms without exposing said conductor; and
   depositing a metal layer in said second via in electrical contact with said substrate to form a gate of said transistor.

2. A method according to claim 1 wherein said second via is opened by a plasma etch which preferentially removes said second insulating layer over said substrate as compared to removing said second insulating layer over said conductor.

3. A method according to claim 1 wherein said second via is opened by implanting said second insulator parallel to said surface, and thereafter removing said implanted insulator by a chemical etch which preferentially etches said implanted insulator as compared to the non-implanted insulator.

4. A method according to claim 1 wherein said first insulating layer is undercut so as to extend beyond said conductor in a cantilevered fashion when said first via is opened.

5. A method according to claim 1 wherein said conductor is comprised of doped polysilicon.

6. A method according to claim 1 wherein said dopant atoms are of an N type conductivity.

7. A method according to claim 1 wherein said substrate is comprised of silicon.

8. A method according to claim 1 wherein metal layer is deposited by forming platinum silicide on said substrate in said second via, forming a layer of material selected from the group of tungsten and titanium-tungsten over said platinum silicide and, forming a layer of aluminum thereover.

9. For use in fabricating a metal semiconductor field effect transistor, a single mask method of fabricating a channel for said transfer and a gate in self-alignment with said channel said method including the steps of:
   forming a conductor on a surface of a semiconductor substrate;
   forming a first insulating layer over said conductor and said surface of said substrate;
   using said single mask to open a first via in said first insulating layer and said conductor which divides said conductor into two spaced-apart portions, exposes said substrate between said spaced-apart portions, and exposes respective sidewalls of said two conductor portions that undercut said first insulating layer;
   implanting impurities of a given conductivity through said via into said substrate to form said channel;
   forming a second insulating layer in said first via such that it covers said exposed substrate and respective conductor sidewalls;
   selectively removing said second insulating layer on said substrate between said respective sidewalls to there expose a portion of said substrate while leaving said second insulating layer on said respective sidewalls, said selective removing being performed without the aid of another mask by an etching step that preferentially etches said insulating layer on said substrate surface as opposed to said insulating layer on said sidewalls; and
   depositing a metal layer in electrical contact with said portion of said substrate to form said gate.

* * * * *